(12) United States Patent
Lin et al.

(10) Patent No.: US 7,449,770 B2
(45) Date of Patent: Nov. 11, 2008

(54) SUBSTRATE WITH SLOT

(75) Inventors: Chiu-Shun Lin, Hsinhua (TW);
Po-Chiang Tseng, Hsinhua (TW);
Chen-Li Wang, Hsinhua (TW);
Chia-Ying Lee, Hsinhua (TW)

(73) Assignee: Himax Technologies, Inc. (TW)

( * ) Notice: Subject to any disclaimer, the term of this patent is extended or adjusted under 35 U.S.C. 154(b) by 335 days.

(21) Appl. No.: 11/341,877

(22) Filed: Jan. 27, 2006

(65) Prior Publication Data

US 2006/0175088 A1 Aug. 10, 2006

(30) Foreign Application Priority Data

Feb. 5, 2005 (TW) ............................... 94104035 A

(51) Int. Cl.
*H01L 23/495* (2006.01)
*H01L 23/52* (2006.01)
*H01L 23/48* (2006.01)
*H01L 23/40* (2006.01)

(52) U.S. Cl. ..................... 257/667; 257/668; 257/672; 257/778; 257/E23.043; 257/E23.046

(58) Field of Classification Search ................. 257/667, 257/668, 672, 778, E23.043, E23.046
See application file for complete search history.

(56) References Cited

U.S. PATENT DOCUMENTS

| 4,330,790 | A | * | 5/1982 | Burns ......................... 257/671 |
| 4,496,965 | A | * | 1/1985 | Orcutt et al. ................. 257/666 |
| 5,812,381 | A | * | 9/1998 | Shigeta et al. .............. 361/813 |
| 6,040,623 | A | | 3/2000 | Chan et al. |
| 2002/0163068 | A1 | * | 11/2002 | Asada .......................... 257/690 |
| 2003/0127711 | A1 | | 7/2003 | Kawai et al. |

* cited by examiner

*Primary Examiner*—Luan Thai
(74) *Attorney, Agent, or Firm*—Ladas & Parry LLP

(57) ABSTRACT

The invention relates to a substrate with slot. The substrate of the invention comprises an active surface and a plurality of metal plates. The metal plates are formed on the active surface. Each metal plate has a first surface and a second surface. The first surface is connected to the active surface. At least one metal plate has at least one slot formed on the second surface. Therefore, according to the substrate with slot of the invention, a resin for connecting a chip and the metal plates can entirely seal sides and corners of the chip so as to prevent water or dust from entering the chip and protect the chip.

6 Claims, 4 Drawing Sheets

SUBSTRATE WITH SLOT

BACKGROUND OF THE INVENTION

1. Field of the Invention

The present invention relates to a substrate, and particularly to a substrate with slot.

2. Description of the Related Art

Referring to FIGS. 1 and 2, the schematic views of a conventional substrate are shown. The conventional substrate 10 comprises an active 10 surface 11, a chip 12, and a plurality of metal plates 13, 14, 15 and 16. The chip 12 and the metal plates 13, 14, 15, 16 are disposed on the active surface 11. The metal plates 13, 14, 15, 16 are grouped into a plurality of wire metal plates 13, 14 and at least one dummy lead 15, 16.

The chip 12 is generally square-shaped, and has a plurality of sides and a plurality of corners. The wire metal plates 13, 14 are disposed near the sides of the chip. The dummy leads 15, 16 are disposed near at least one corner of the chip 12. The wire metal plates 13, 14 are used to electrically connect the chip 12. The dummy leads 15, 16 are not electrically connected to the chip 12.

The substrate 10 further comprises a resin 17 surrounding the sides and the corners of the chip 12. The resin 17 is used for hermetically connecting the chip 12 and the metal plates 13, 14, 15, 16 to protect the chip 12. However, since the metal plates 15, 16 on the corner of the chip 12 have large areas, when the resin 17 is coated between the corner of the- chip 12 and the dummy plates 15, 16, the resin 17 on the metal plates 15, 16 may slightly shrink back toward the corner of the chip. Moreover, if subsequently subjected to a heating process, the resin 17 may shrink back to the corner of the chip 12, so that the corner of the chip 12 is not sealed with resin 17, and water, dust, and the like may intrude into the chip 12 from the corner, causing the chip 12 to be unable to operate normally.

Therefore, it is necessary to provide a substrate to solve said the above problem.

SUMMARY OF THE INVENTION

The objective of the present invention is to provide a substrate with slot. The substrate of the invention comprises an active surface and a plurality of metal plates. The metal plates are formed on the active surface. Each metal plate has a first surface and a second surface. The first surface is connected to the active surface. At least one metal plate has at least one slot formed on the second surface.

Therefore, according to the substrate with slot of the invention, a resin for connecting a chip and the metal plates can entirely seal the sides and the corners of the chip so as to prevent water or dust from entering the chip and protect the chip.

DETAILED DESCRIPTION OF THE INVENTION

Figure 3:
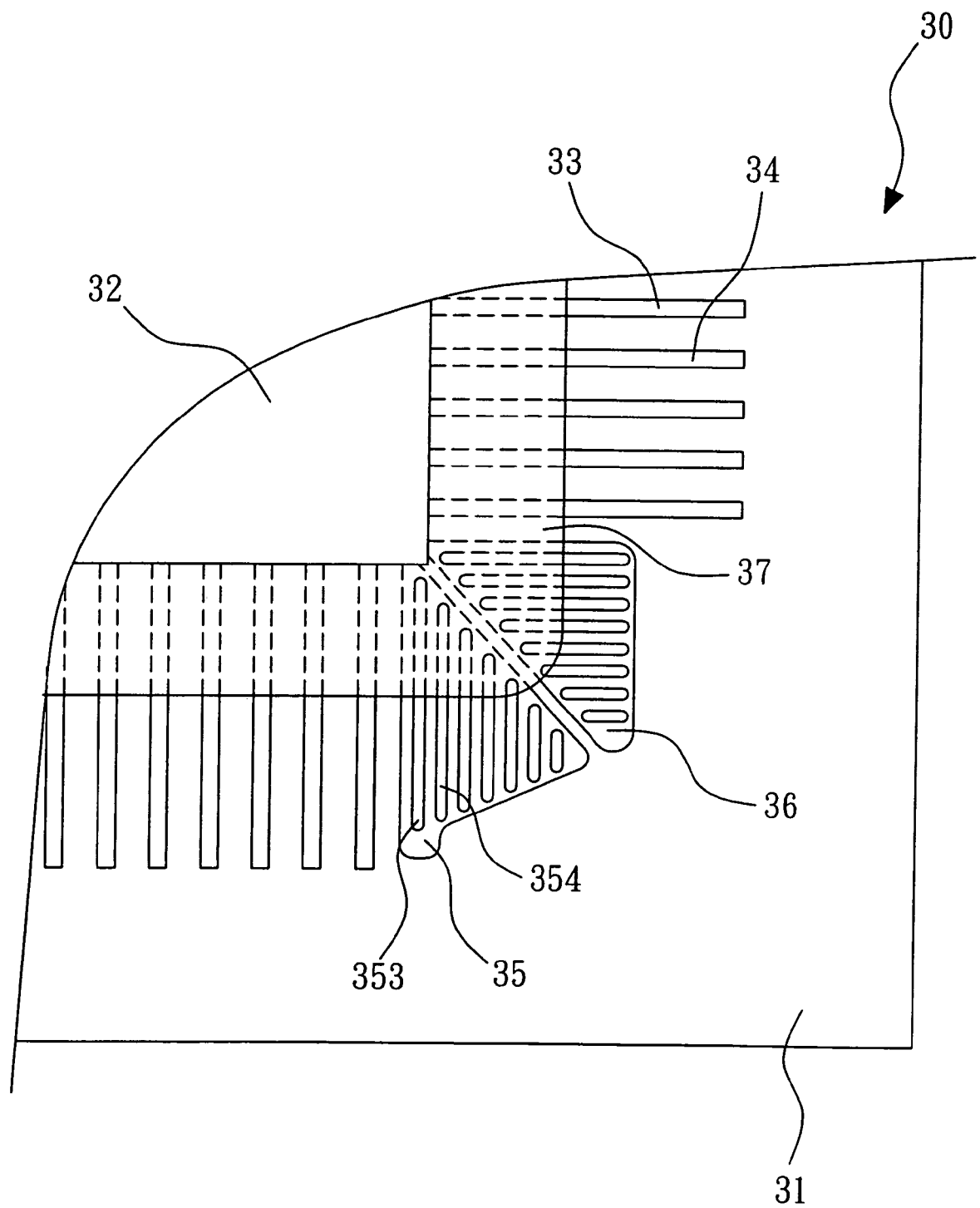
FIG. 3 is a partially enlarged schematic view of a substrate with slot according to the invention.

Referring to FIG. 3, it is the schematic view of the substrate with slot according to the invention. The substrate 30 comprises an active surface 31, a chip 32 and a plurality of metal plates 33, 34, 35 and 36. The substrate 30 may be a flexible substrate or a flexible printed circuit board (FPC). The material of the substrate 30 may be, but not limited to, Polyimide (PI). Alternatively, the substrate of the invention can be applied to the tape carrier package (TCP) or chip on film (COF).

The chip 32 and the metal plates 33, 34, 35, 36 are disposed on the active surface 31. The metal plates 33, 34, 35, 36 are grouped into a plurality of wire metal plates 33, 34, and at least one dummy lead 35, 36. The chip 32 is generally square-shaped, and has a plurality of sides and a plurality of corners. The wire metal plates 33, 34 are disposed on a corresponding position of the sides of the chip 32 and are used for electrically connecting to the chip 32. The dummy leads 35, 36 are disposed on a corresponding position of at least one corner (e.g. the bottom right corner shown in FIG. 3) of the chip 32. The dummy leads 35, 36 are not electrically connected to the chip 32.

The substrate 30 further comprises a resin 37 surroundingly coated on the sides and the corners of the chip 32. The resin 37 is used for hermetically connecting the chip 32 and the metal plates 33, 34, 35, 36, to protect the chip 32.

Figure 1:
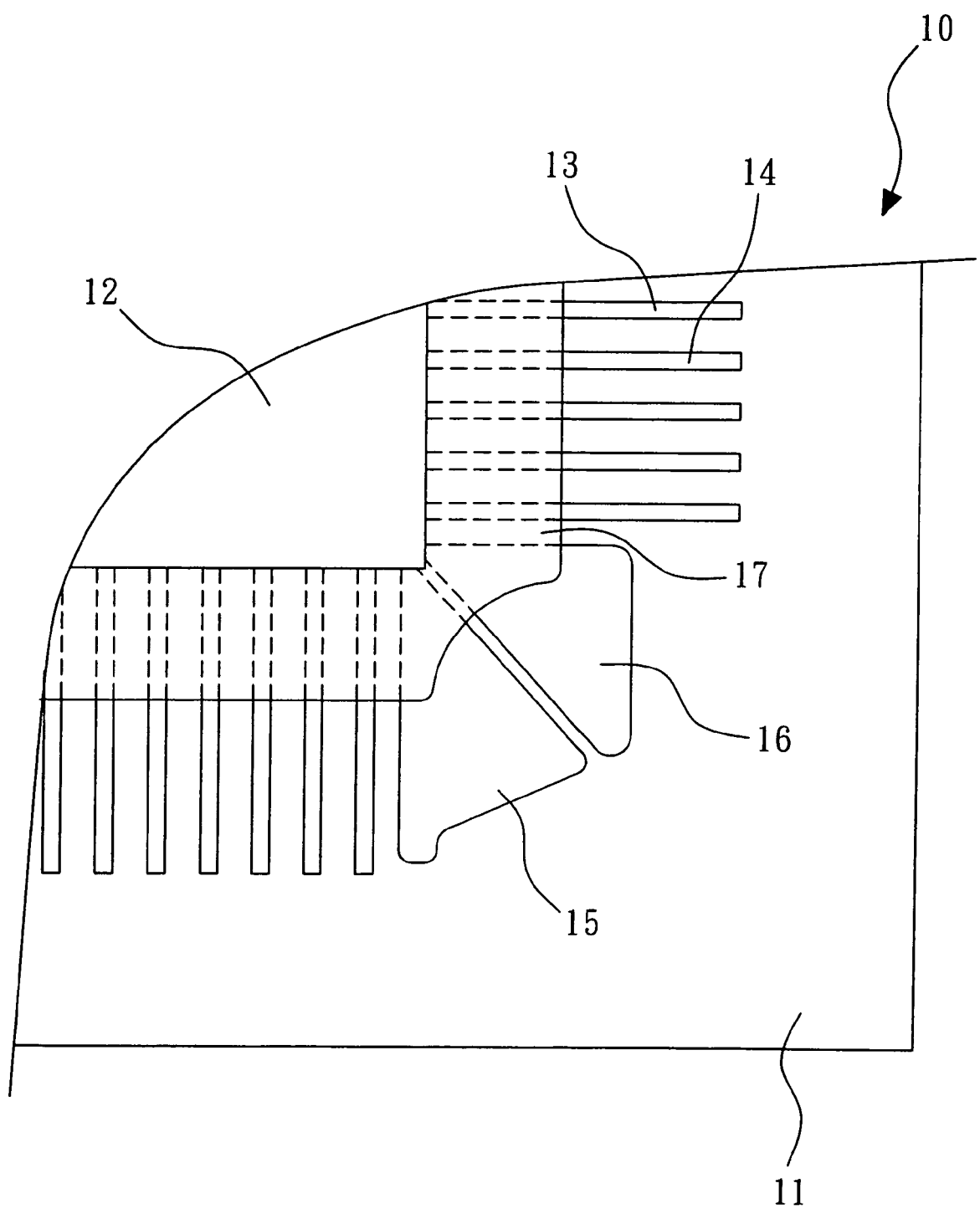
FIG. 1 is a partially enlarged schematic view of a conventional substrate.
Figure 2:
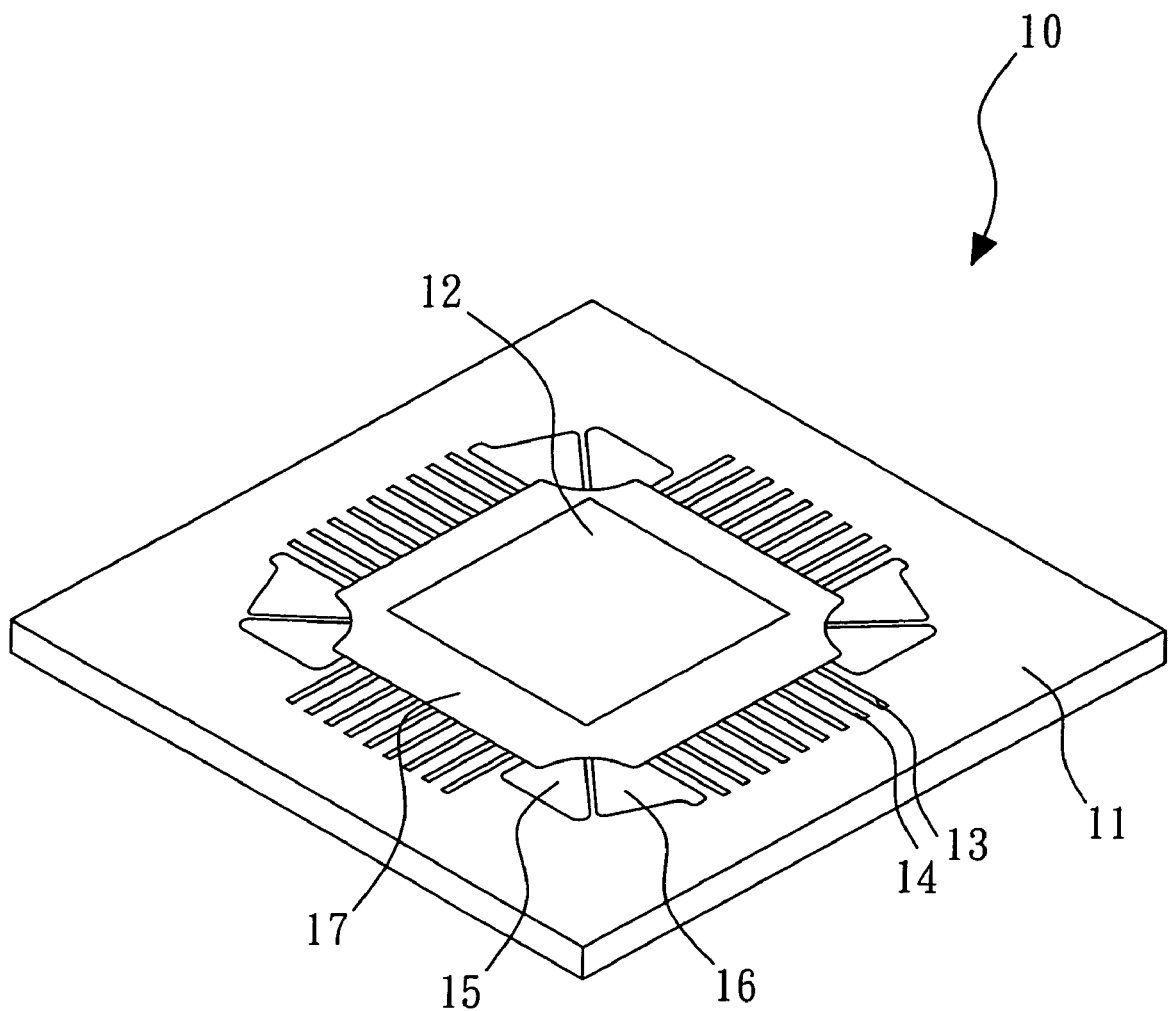
FIG. 2 is a perspective schematic view of a conventional substrate.
Figure 4:
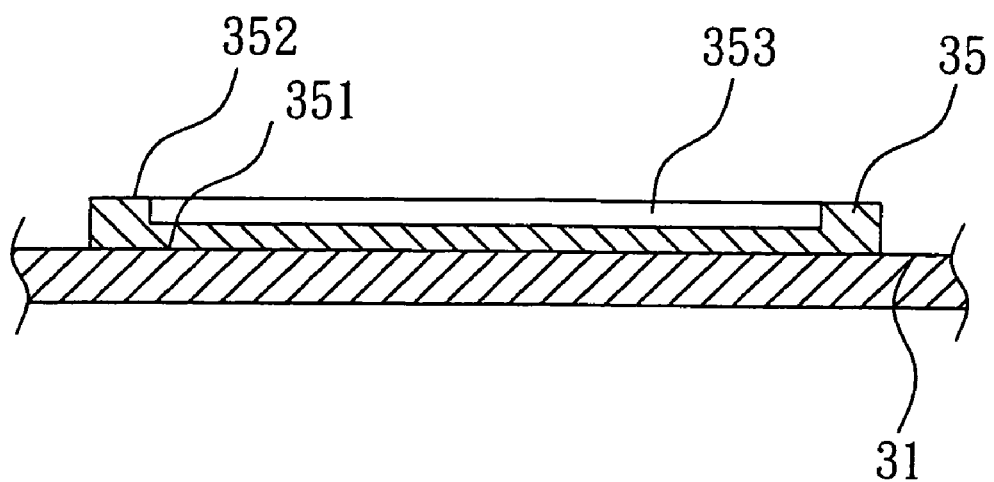
FIG. 4 is a schematic sectional view of the slot according to a first embodiment of the invention.

Referring to FIG. 3 and FIG. 4, the dummy lead 35 is illustrated as an example. The dummy lead 35 has a first surface 351 and a second surface 352. The first surface 351 is connected to the active surface 31. At least one of the slots 353, 354 is formed on the second surface 352. The depths of the slots 353, 354 are less than the height (i.e. the height from the first surface 351 to the second surface 352) of the dummy lead 35. Because the dummy lead 35 has a plurality of slots 353 and 354, the resin 37 can be retained within the slots 353 and 354, so that the phenomena that the resin 17 shrinks back to the corner (as shown in FIG. 1) will not occur.

Therefore, using the substrate 30 with slot of the invention, the resin 37 can entirely surround the sides and the corners of the chip 32, and completely hermetically connect the chip 32 and the plurality of metal plates 33, 34, 35, 36 to prevent water or dust from entering the chip 32 and protect the chip 32.

The slots 353, 354 are not limited to the shape and the amount as shown in FIG. 3 and FIG. 4. It will be acceptable if the metal plate has at least one slot for preventing the resin 37 from receding. Moreover, the dummy leads 35, 36 can also be disposed on a corresponding position of the sides of the chip 32, and meanwhile, the slots are not only limited to be disposed on the dummy leads 35, 36, but also can be disposed on the wire metal plates 33, 34, so that the resin 37 on the wire metal plates 33, 34 will not shrink back so as to prevent the resin 37 from receding to the sides of chip 32 which produces an gap resulting in the defect of failing to entirely seal and protect the chip 32.

Figure 5:
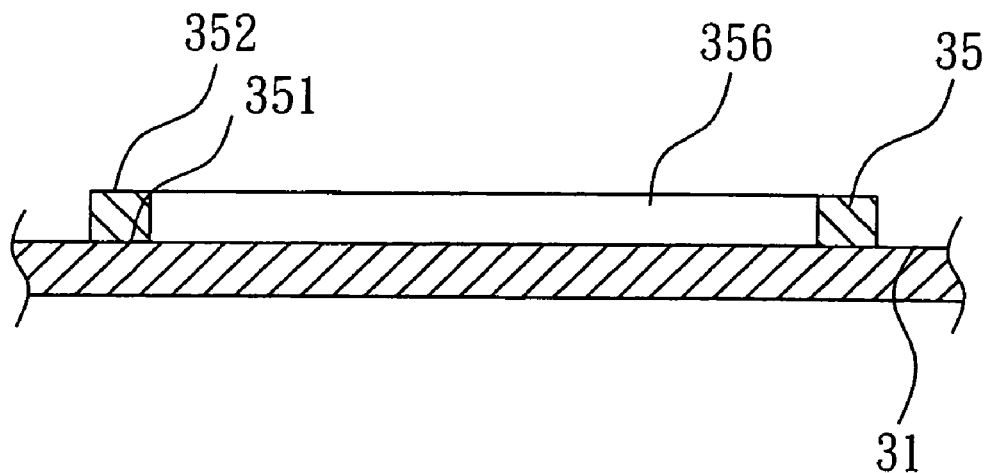
FIG. 5 is a schematic sectional view of the slot according to a second embodiment of the invention.

Referring to FIG. 5, it shows a schematic view of the slot according to a second embodiment of the invention. Likewise, the dummy lead 35 is illustrated as an example. The slot 356 of the dummy lead 35 is a through hole running through the first surface 351 and the second surface 352 of the dummy lead 35. Using the through hole slot 356, the resin 37 can also be retained within the slot 356, without receding so as to protect the chip 32.

The embodiments illustrated above are only to illustrate the principle and the efficacy of the invention, but not intended to limit the scope of the invention. Therefore, it is apparent to those skilled in the art that various modifications and variations can be made without departing from the spirit of the invention. The claims of the invention are defined by the claims below.

While several embodiments of the present invention have been illustrated and described, various modifications and improvements can be made by those skilled in the art. The embodiment of the present invention is therefore described in an illustrative, but not restrictive, sense. It is intended that the present invention may not be limited to the particular forms as illustrated, and that all modifications which maintain the spirit and scope of the present invention are within the scope as defined in the appended claims.

What is claimed is:

1. A substrate with a slot, comprising:
   an active surface;
   a plurality of metal plates on the active surface, the metal plates respectively having a first surface and a second surface, the first surface being connected to the active surface, wherein at least one of the metal plates at least one slot on the second surface and the metal plates are grouped into a plurality of wire metal plates and at least one dummy lead;
   at least one chip on the active surface and electrically connected to the wire metal plates, wherein the chip has a plurality of sides and a plurality of corners, the wire metal plates are on a corresponding position of the sides of the chip, and the dummy lead is on a corresponding position of at least one corner of the chip, and the dummy lead is not electrically connected to the chip; and
   a resin surroundingly coated on the sides and the corners of the chip, and hermetically connecting the chip and the metal plates,
   wherein the dummy lead has at least one slot for retaining the resin therein.

2. The substrate according to claim 1, wherein the substrate is a flexible substrate.

3. The substrate according to claim 1, wherein the depth of the slot is less than the height of the metal plate.

4. The substrate according to claim 1, wherein the slot is a through hole running through the first surface and the second surface of the metal plate.

5. The substrate according to claim 1, wherein at least one metal plates disposed on a corresponding position of the sides of the chip has at least one slot.

6. The substrate according to claim 1, wherein at least one metal plates disposed on a corresponding position of the corners of the chip has at least one slot.

* * * * *